United States Patent
Yu et al.

(10) Patent No.: US 9,054,024 B2
(45) Date of Patent: Jun. 9, 2015

(54) APPARATUS AND METHOD FOR OPTICAL COMMUNICATIONS

(75) Inventors: Fei Yu, Santa Clara, CA (US); Qi Deng, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 186 days.

(21) Appl. No.: 13/372,246

(22) Filed: Feb. 13, 2012

(65) Prior Publication Data

US 2013/0207127 A1 Aug. 15, 2013

(51) Int. Cl.
*H01L 21/00* (2006.01)
*H01L 25/16* (2006.01)
*H01L 21/02* (2006.01)
*G02B 6/42* (2006.01)

(52) U.S. Cl.
CPC ........ *H01L 25/167* (2013.01); *H01L 21/02365* (2013.01); *G02B 6/4214* (2013.01); *H01L 2224/16* (2013.01); *G02B 6/428* (2013.01); *G02B 6/4246* (2013.01)

(58) Field of Classification Search
CPC .............. H01L 21/02365; H01L 27/14; H01L 27/3227; H01L 31/0232; H01L 31/14
See application file for complete search history.

(56) References Cited

U.S. PATENT DOCUMENTS

| | | | |
|---|---|---|---|
| 5,071,213 A * | 12/1991 | Chan | 385/52 |
| 5,987,202 A * | 11/1999 | Gruenwald et al. | 385/49 |
| 6,580,858 B2 * | 6/2003 | Chen et al. | 385/48 |
| 6,901,185 B2 * | 5/2005 | Sasaki et al. | 385/33 |
| 2004/0208416 A1 | 10/2004 | Chakravorty et al. | |
| 2005/0249462 A1 * | 11/2005 | Alduino et al. | 385/49 |
| 2007/0297713 A1 | 12/2007 | Lu et al. | |
| 2010/0129036 A1 | 5/2010 | Hodono | |
| 2011/0064354 A1 | 3/2011 | Nishio et al. | |

FOREIGN PATENT DOCUMENTS

CN 101738684 A 6/2010
EP 0807981 A2 11/1997

OTHER PUBLICATIONS

"Development of hybrid 3D stack and Demonstration of Optical Interconnects," A Star IME, EPRC—9 Project Proposal, 12 pages, Aug. 24, 2007, 12 pages.
International Search Report and Written Opinion of Patent Cooperation Treaty (PCT), International Application No. PCT/CN2013/071609, Applicants Huawei Technologies Co., Ltd., date of mailing May 23, 2013, 10 pages.
Extended European Search Report received in Application No. 13748500.9-1504 PCT/CN2013/071609 mailed Feb. 4, 2015, 8 pages.

* cited by examiner

*Primary Examiner* — Su C Kim
(74) *Attorney, Agent, or Firm* — Slater & Matsil, L.L.P.

(57) ABSTRACT

An integrated circuit package includes a substrate having a recess formed along at least a portion of a perimeter of the substrate, and an optical die having opto-electric circuitry, the optical die coupled to the substrate such that a portion of the optical die with the opto-electric circuitry overhangs the recess. The integrated circuit package also includes an optical unit disposed in the recess such that optical signals emitted by the opto-electric circuitry are reflected away from the substrate and incident optical signals are reflected onto the opto-electric circuitry.

24 Claims, 16 Drawing Sheets

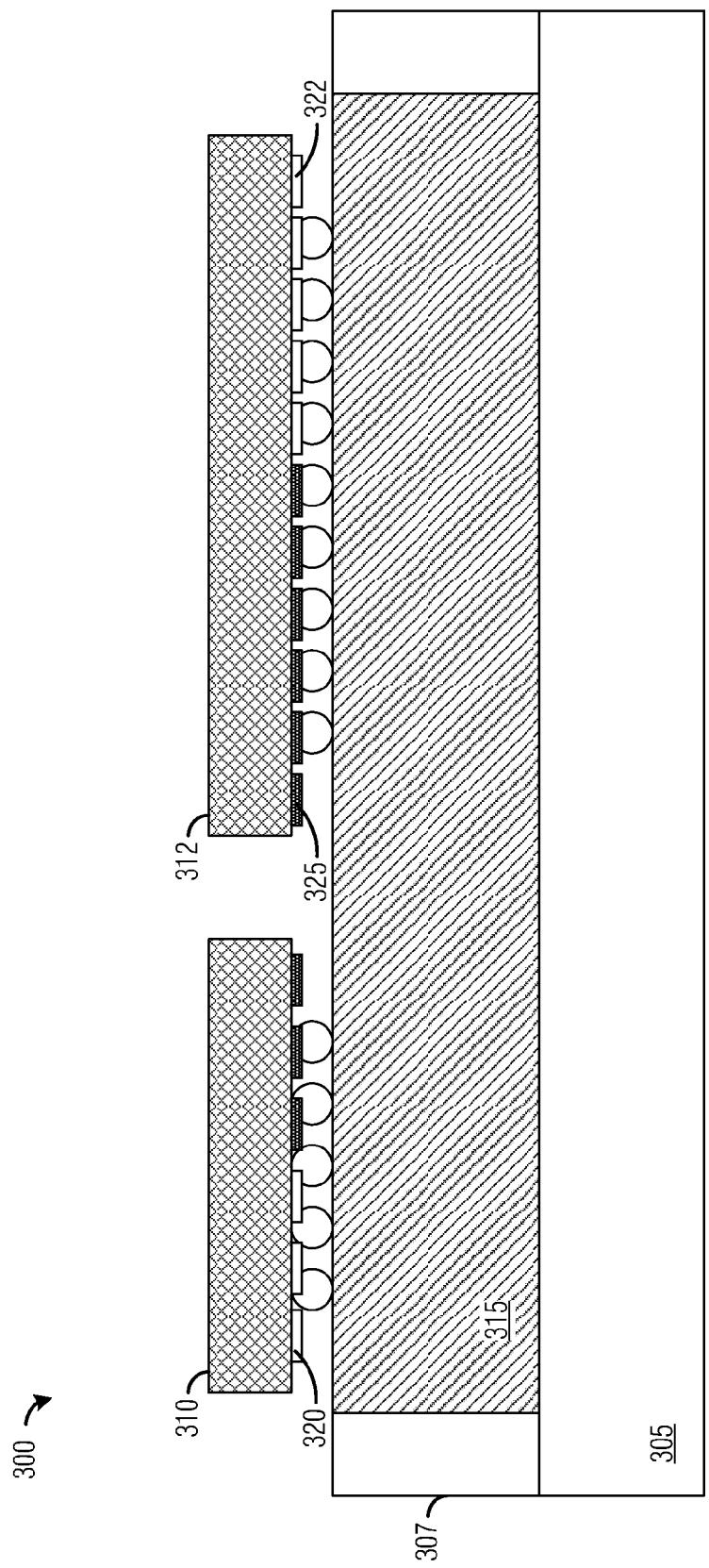

930

940

950

960

970

APPARATUS AND METHOD FOR OPTICAL COMMUNICATIONS

TECHNICAL FIELD

The present invention relates generally to integrated circuits, and more particularly to a system and method for optical communications.

BACKGROUND

The development of multi-chip modules that allow multiple separately manufactured integrated circuits to be combined in a single package have permitted a significant increase in the functionality of a single package. However, together with the increase in functionality, there is generally a corresponding increase in need for high data rate communications.

The integration of opto-electric circuitry used for optical communications with electrical circuitry has permitted extremely high data rate communications for the integrated circuit. However, opto-electric circuitry is generally difficult to fabricate. Additionally, a high degree of precision is needed to maintain proper alignment of the opto-electric circuitry.

SUMMARY OF THE INVENTION

Example embodiments of the present invention which provide an apparatus and method for optical communications.

In accordance with an example embodiment of the present invention, an integrated circuit package is provided. The integrated circuit package includes a substrate having a recess formed along at least a portion of a perimeter of the substrate. The integrated circuit package also includes an optical die having opto-electric circuitry, the optical die coupled to the substrate such that a portion of the optical die with the opto-electric circuitry overhangs the recess. The integrated circuit package further includes an optical unit disposed in the recess such that optical signals emitted by the opto-electric circuitry are reflected away from the substrate and incident optical signals are reflected onto the opto-electric circuitry.

In accordance with another example embodiment of the present invention, an integrated circuit package is provided. The integrated circuit package includes a substrate, and an optical unit coupled to an end of the substrate. The integrated circuit package also includes an opto-electric die having opto-electric circuitry, the opto-electric die coupled to the substrate such that a portion of the opto-electric die with the opto-electric circuitry overhangs the end and over the optical unit. Where optical signals emitted by the opto-electric circuitry are reflected away from the substrate by the optical unit and incident optical signals are reflected onto the opto-electric circuitry by the optical unit.

In accordance with another example embodiment of the present invention, a method of manufacturing a multi-chip module is provided. The method includes fabricating a substrate having a recess formed along at least a portion of a perimeter of the substrate, and attaching an optical die with opto-electric circuitry to the substrate so that at least a portion of the optical die with the opto-electric circuitry overhangs the recess. The method also includes placing an optical unit in the recess, the optical unit oriented so that optical signals emitted by the opto-electric circuitry are reflected away from the substrate and incident optical signals are reflected onto the opto-electric circuitry.

One advantage of an embodiment is that there is a reduction in the degree of precision needed to maintain proper alignment of the opto-electric circuitry. The reduction in the precision helps to simplify manufacture and therefore, reduces manufacturing costs.

Another advantage of an embodiment is that an optical chip and its electrical driver interconnection (on an electrical chip) may be placed adjacent to one another, placed on opposite sides of the substrate, which allows for high speed operation. Furthermore, since a hole in the substrate is not required, the embodiment may be very compact.

A further advantage of an embodiment is that light guides are not required, further simplifying manufacture and reducing costs.

BRIEF DESCRIPTION OF THE DRAWINGS

For a more complete understanding of the present invention, and the advantages thereof, reference is now made to the following descriptions taken in conjunction with the accompanying drawing, in which:

FIG. 3 illustrates an example a side view of one side of a multi-chip module, wherein an entirety of a single side of the multi-chip module is shown according to example embodiments described herein;

DETAILED DESCRIPTION OF ILLUSTRATIVE EMBODIMENTS

The manufacture of the current example embodiments and the structure thereof are discussed in detail below. It should be appreciated, however, that the present invention provides many applicable inventive concepts that can be embodied in a wide variety of specific contexts. The specific embodiments discussed are merely illustrative of specific structures of the invention and ways to manufacture the invention, and do not limit the scope of the invention.

One embodiment of the invention relates to optical communications in an integrated circuit. For example, an optical unit located in a recess formed along a portion of a perimeter of a substrate reflects optical signals emitted by opto-electrical circuitry on a die that overhangs the recess away from the substrate and reflects incident optical signals onto the opto-electric circuitry. For example, an optical unit attached to an edge of a substrate reflects optical signals emitted by opto-electrical circuitry on a die that overhangs the edge away from the substrate and reflects incident optical signals onto the opto-electric circuitry.

The present invention will be described with respect to example embodiments in a specific context, namely an integrated circuit with opto-electric circuitry used to provide high data rate communications. The present invention may also be applicable to multi-chip modules, and the like.

Generally, in vertical emitting or receiving optical chips, such as those utilizing vertical-cavity surface emitting laser (VCSEL) and/or photo diodes (e.g., pin diodes), die attachment is face up, and then wire bonded to a carrier or substrate. Typically, this is easier to design and implement for both optical and electrical interconnections, as compared to a flip chip optical die. Wire bonding works well up to speeds of 10 Gbps or 12.5 Gbps. However, when speeds approach or exceed 20 Gbps to 25 Gpbs, wire bonding may not provide sufficient bandwidth to meet data rate requirements. Flip chips may be able to meet and/or exceed the bandwidth requirements.

Figure 1:
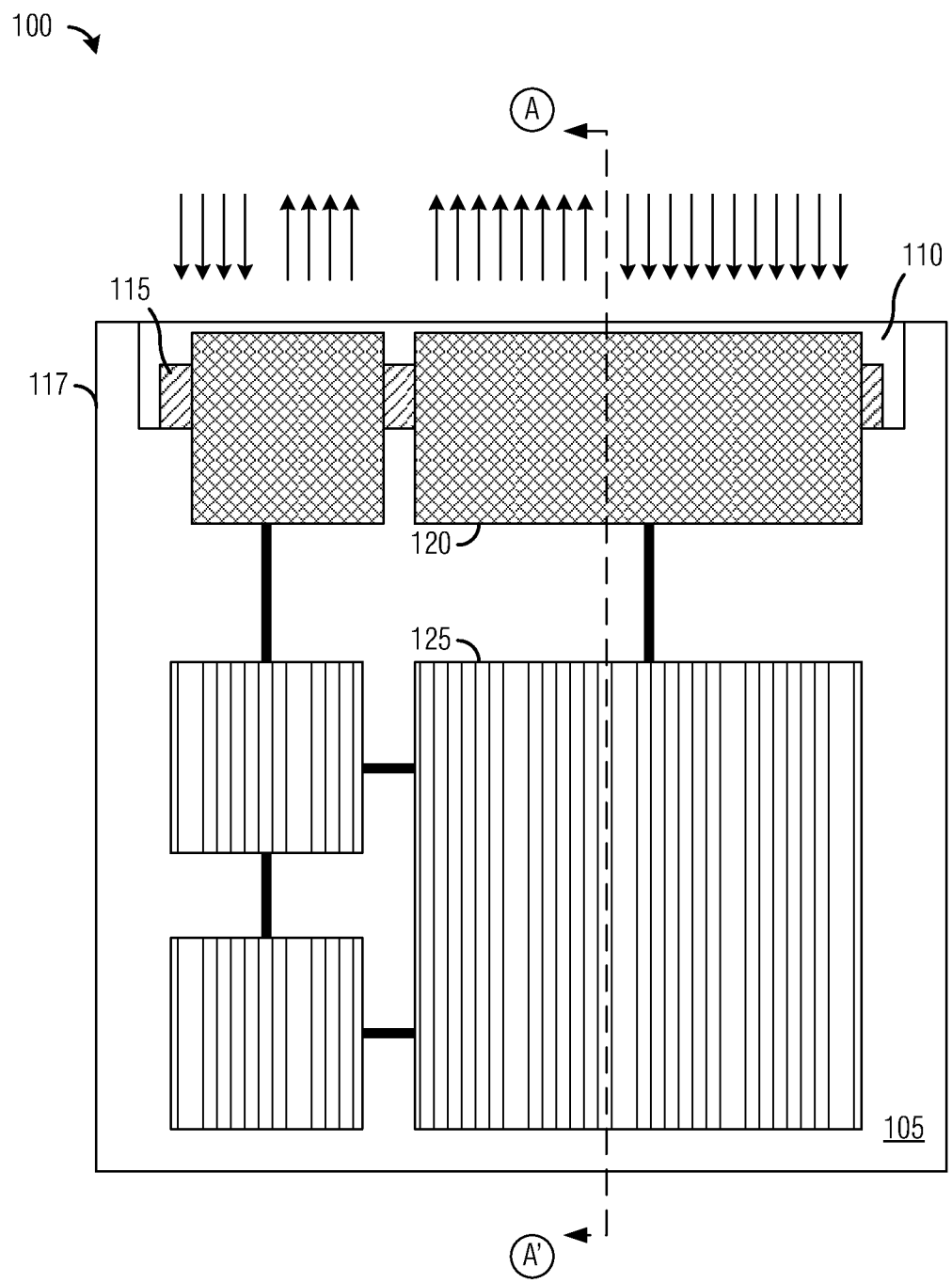
FIG. 1 illustrates a top view of a multi-chip module according to example embodiments described herein.

FIG. 1 illustrates a top view of a multi-chip module 100. Multi-chip module 100 may be used in a wide range of applications, such as short reach optical interconnections between router to router, data center cabinets, and the like. Multi-chip module 100 includes a substrate 105 with a recess (in an example embodiment, the recess may also be referred to as a notch or a step) 110 formed along a portion of its perimeter 117. A mirror 115 may be disposed within recess 110 and may be used to reflect light (e.g., optical signals). A die 120 having opto-electric circuitry may be mounted on a surface of substrate 105. According to an example embodiment, die 120 is mounted on a surface of substrate 105 that also includes recess 110 and mirror 115. The opto-electric circuitry on die 120 may be used to convert optical signals into electrical signals and/or electrical signals into optical signals, among other things, such as signal amplification, signal filtering, and the like. A portion of die 120 overhangs recess 110, with the portion of die 120 that overhangs recess 110 including optical detectors and/or optical emitters. A die 125 may also be mounted on a surface of substrate 105. Die 125 may be electrically coupled to die 120.

According to an example embodiment, die 120 and die 125 may be may be bonded to substrate 105 with ball grid array (BGA) balls, electrical connectors (such as land grid array (LGA) socket connector), wire bonding, or any other form of electrical connection. Die 120 and die 125 may be electrically connected by electrical connectors, such as electrical traces, wire bonds, and the like. Additionally, although shown in FIG. 1 as being bonded to a single surface of substrate 105, die 120 and die 125 may be bonded to different surfaces of substrate 105. The arrangement of die 107 and die 109 may be dependent on application and parameters such as size, power requirements, performance requirements, and the like, to optimize signal and/or thermal performance.

Although shown in FIG. 1 as being formed along a single side of substrate 105, recess 110 may be formed along one or more sides of substrate 105. In general, recess 110 may be as large or as small as needed to allow for the integration of a sufficient number of optical emitters and/or optical detectors to meet communications requirements of multi-chip module 100.

Figure 2A:
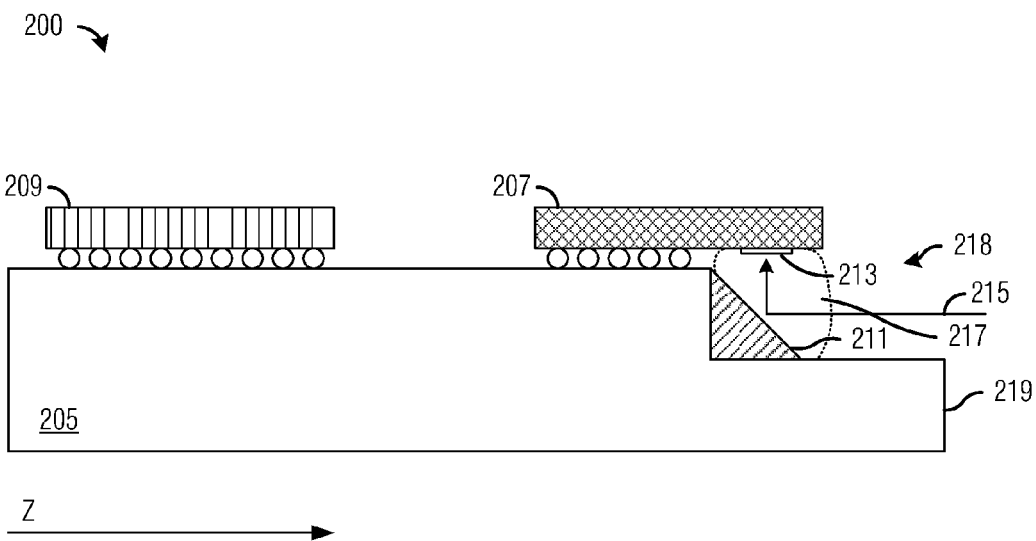
FIGS. 2a through 2e illustrate example side views of multi-chip modules according to example embodiments described herein.

FIG. 2a illustrates a side view of a first multi-chip module 200. The side view of first multi-chip module 200 may be illustrative of a side view of multi-chip module 100 along dashed line A-A'. First multi-chip module 200 includes a substrate 205 with a recess (or notch or step) 218 formed on an end 219 along a portion of its perimeter. A die 207 having opto-electric circuitry and a die 209 having electric circuitry may be mounted on a surface of substrate 205. A portion of die 207 overhangs recess 218, with the portion of die 207 that overhangs recess 218 including optical detectors and/or optical emitters. As an example, as shown in FIG. 2a, an optical detector 213 overhangs recess 218.

A mirror 211 may be disposed in recess 218. Mirror 211 may be oriented so that light emitted by the opto-electric circuitry on die 207 is reflected away from substrate 205, while light incident to substrate 205 is reflected onto the opto-electric circuitry. Additionally, paste (or glue, and the like) 217, which may be optically transparent to the wavelength of light being used by the optical detectors and/or optical emitters, may be applied to provide mechanical support and/or physical protection for die 207, as well as minor 211. Paste 217 may be optional. As shown in FIG. 2a, light beam 215 incident to substrate 205 is reflected onto optical detector 213 by mirror 211. As an example, for light that is parallel to substrate 205, mirror 211 may be oriented at about 45 degrees to an axis Z of substrate 205 so that light incident to substrate 205 is reflected onto the opto-electric circuitry and light emitted by the opto-electric circuitry is reflected away from substrate 105. According to an example embodiment, minor 211 may not need to be precisely oriented at 45 degrees, instead minor 211 may be oriented at 45 degrees plus or minus a margin, where the margin depends on a size of the optical detectors and/or optical emitters, a distance of the optical detectors and/or optical emitters from minor 211, a size of external optical emitters and/or optical detectors, a distance of external optical emitters and/or optical detectors from substrate 205, and the like.

According to an example embodiment, mirror 211 may be fabricated in a separate fabrication process and placed in recess 218. Minor 211 may be attached to substrate 205 with some form of adhesive. According to another example embodiment, mirror 211 may be fabricated directly from the material of substrate 205. As an example, fabrication of recess 218 itself may also fabricate mirror 211. According to an example embodiment, minor 211 may be fabricated from a material that has reflective properties in an optical wavelength range that encompasses the wavelength of light used by the optical emitters and/or optical detectors. According to another example embodiment, mirror 211 may be fabricated by laser etching or chemical etching. Furthermore, a reflective material, such as copper, aluminum, film, gold, and the like, may be sputtered or plated onto a surface of mirror 211. According to another example embodiment, minor 211 may be fabricated as a molded part with an integrated minor, lens, a mechanical transfer ferrule (such as a Multiple-Fiber Push-On/Pull-off (MPO) ferrule), and the like. Mirror 211, molded part with integrated minor, lens, MPO ferrule, and the like, may be referred to as an optical unit.

Although shown in FIG. 2a as having a single optical detector, die 207 may have a plurality of optical detectors and/or optical emitters. The plurality of optical detectors may be arranged in a linear array or a two-dimensional array.

Figure 2B:
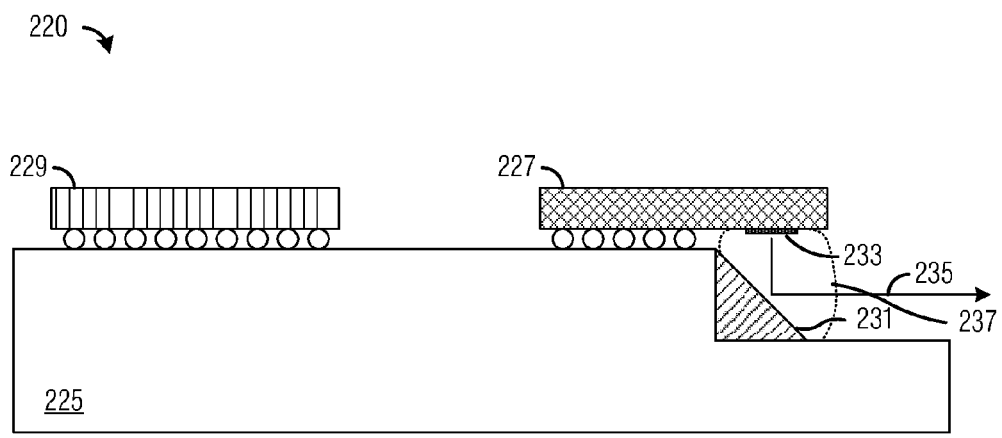

FIG. 2b illustrates a side view of a second multi-chip module 220. The side view of second multi-chip module 220 may be illustrative of a side view of multi-chip module 100 along dashed line A-A'. Second multi-chip module 220 includes a substrate 225 with a recess or step formed along a portion of its perimeter. A die 227 having opto-electric circuitry and a die 229 having electric circuitry may be mounted on a surface of substrate 225. A portion of die 227 overhangs the recess, with the portion of die 227 that overhangs the recess including optical detectors and/or optical emitters. As an example, as shown in FIG. 2b, an optical emitter 233 overhangs the recess. A mirror 231 may be disposed in the recess. Mirror 231 may be oriented so that light emitted by the opto-electric circuitry on die 227 is reflected away from substrate 225, while light incident to substrate 225 is reflected onto the opto-electric circuitry. Additionally, paste (or glue, and the like) 237, which may be optically transparent to the wavelength of light being used by the optical detectors and/or optical emitters, may be applied to provide mechanical support and/or physical protection for die 227, as well as mirror 231. Paste 237 may be optional. As shown in FIG. 2b, light beam 235 emitted by optical emitter 233 is reflected away from substrate 225 by minor 231.

Figure 2C:
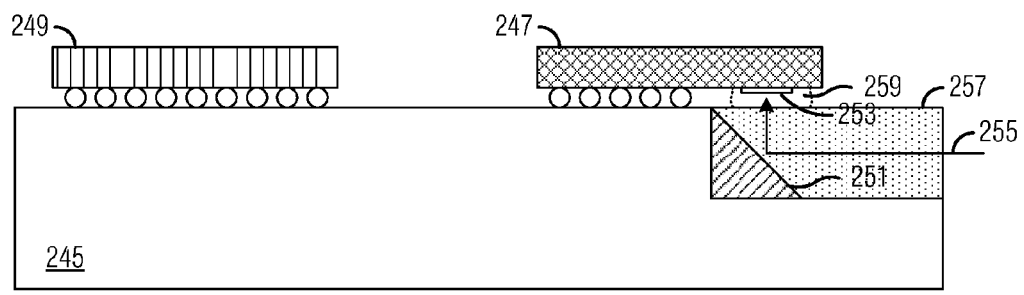

FIG. 2c illustrates a side view of a third multi-chip module 240. Third multi-chip module 240 includes a substrate 245 with a recess or step formed along a portion of its perimeter. A die 247 having opto-electric circuitry and a die 249 having electric circuitry may be mounted on a surface of substrate 245. A portion of die 247 overhangs the recess, with the portion of die 247 that overhangs the recess including optical detectors and/or optical emitters. As an example, as shown in FIG. 2c, an optical detector 253 overhangs the recess. A minor 251 may be disposed in the recess. As shown in FIG. 2c, light beam 255 incident to substrate 245 is reflected onto optical detector 253 by mirror 251. A light guide 257 helps to direct light to and/or away from substrate 245. As shown in FIG. 2c, light guide 257 may not make direct contact with optical detector 253. Additionally, paste (or glue, and the like) 259, which may be optically transparent to the wavelength of light being used by the optical detectors and/or optical emitters, may be applied to provide mechanical support and/or physical protection for die 247, as well as light guide 257. Paste 259 may be optional. Although FIG. 2c illustrates third multi-chip module 240 as having an optical detector, third multi-chip module 240 may also include an optical emitter or may only have an optical emitter.

Figure 2D:
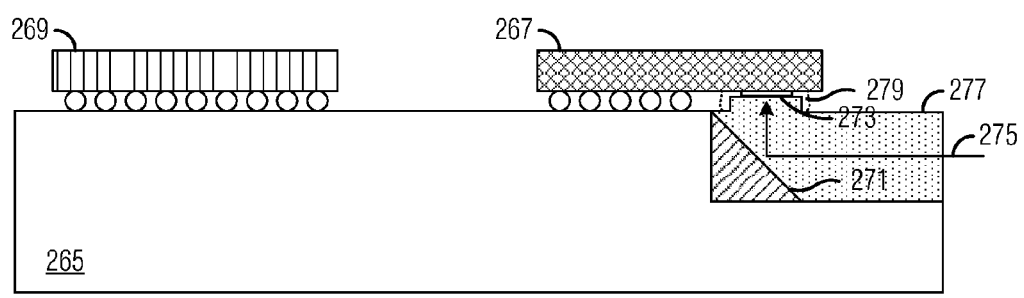

FIG. 2d illustrates a side view of a fourth multi-chip module 260. Fourth multi-chip module 260 includes a substrate 265 with a recess or step formed along a portion of its perimeter. A die 267 having opto-electric circuitry and a die 269 having electric circuitry may be mounted on a surface of substrate 265. A portion of die 267 overhangs the recess, with the portion of die 267 that overhangs the recess including optical detectors and/or optical emitters. As an example, as shown in FIG. 2d, an optical detector 273 overhangs the recess. A minor 271 may be disposed in the recess. As shown in FIG. 2d, light beam 275 incident to substrate 265 is reflected onto optical detector 273 by minor 271. A light guide 277 helps to direct light to and/or away from substrate 245. As shown in FIG. 2d, light guide 277 may make direct contact with optical detector 273. Additionally, paste (or glue, and the like) 279, which may be optically transparent to the wavelength of light being used by the optical detectors and/or optical emitters, may be applied to provide mechanical support and/or physical protection for die 267, as well as light guide 277. Paste 279 may be optional. Although FIG. 2d illustrates fourth multi-chip module 260 as having an optical detector, fourth multi-chip module 260 may also include a optical emitter or may only have a optical emitter.

Figure 2E:
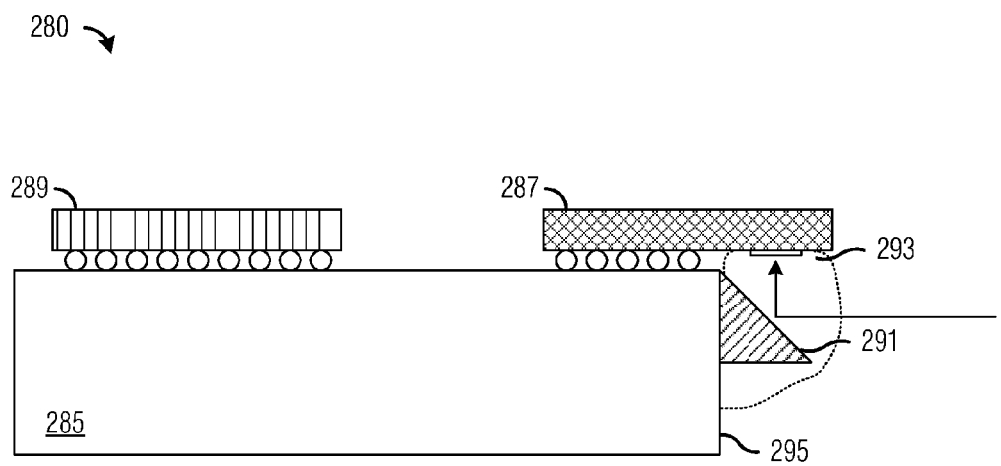

FIG. 2e illustrates a side view of a fifth multi-chip module 280. According to an example embodiment, a mirror, such as minors 211, 231, 251, and 271, may also be attached directly to a side of a substrate instead of in a recess. Fifth multi-chip module 280 includes a substrate 285. A die 287 having opto-electric circuitry and a die 289 having electric circuitry may be mounted on a surface of substrate 285. A portion of die 287 overhangs substrate 285, with the portion of die 287 that overhangs substrate 287 including optical detectors and/or optical emitters. As an example, as shown in FIG. 2e, an optical detector overhangs substrate 285. A minor 291 may be attached directly to an end 295 of substrate 285. As shown in FIG. 2e, light beam incident to substrate 285 is reflected onto the optical detector by minor 291. Additionally, paste (or glue, adhesive, and the like) 293, which may be optically transparent to the wavelength of light being used by the optical detectors and/or optical emitters, may be applied to provide mechanical support and/or physical protection for die 287, as well as mirror 291. Paste 293 may also help to attach mirror 291 to side 295 of substrate 285. Paste 293 may be optional. Although FIG. 2e illustrates fifth multi-chip module 280 as having an optical detector, fifth multi-chip module 280 may also include an optical emitter or may only have an optical emitter.

FIG. 3 illustrates a side view of one side of a multi-chip module 300, wherein an entirety of a single side of multi-chip module 300 is shown. As shown in FIG. 3, multi-chip module 300 includes a substrate 305 with a recess (or step) 307 formed along a portion of its perimeter. A first die 310 having opto-electric circuitry and a second die 312 also having opto-electric circuitry may be mounted on a surface of substrate 305. A portion of first die 310 overhangs recess 307 with the portion of first die 310 that overhangs recess 307 including optical detectors and/or optical emitters. Similarly, a portion of second die 312 overhangs recess 307 with the portion of second die 312 that overhangs recess 307 including optical detectors and/or optical emitters. As an example, the portion of first die 310 overhanging recess 307 may include optical detectors (or optical emitters), while the portion of second die 312 overhanging recess 307 may include optical emitters (or optical detectors). It is noted that optical detectors are shown as unshaded boxes, e.g., optical detectors 320 and 322, and optical emitters are shown as shaded-dotted boxes, e.g., optical emitter 325. As another example, the portion of first die 310 overhanging recess 307 may include optical detectors and optical emitters for a first set of functions performed by multi-chip module 300, while the portion of second die 312 overhanging recess 307 may include optical detectors and optical emitters for a second set of functions performed by multi-chip module 300.

Multi-chip module 300 also includes a minor 315 in recess 307 that may reflect light emitted by opto-electric circuitry in first die 310 and/or second die 312 away from substrate 305 and reflect light incident to substrate 305 onto opto-electric circuitry in first die 310 and/or second die 312. According to an example embodiment, a single monolithic mirror may be used in a single recess by one or more die (e.g., first die 310 and second die 312). According to an alternative example embodiment, each die overhanging a recess may use its own individual minor. It is noted that optional paste and/or glue that is optically transparent and used to provide mechanical support and/or physical protection to mirror 315 and/or die 310 and die 312 is not shown in FIG. 3 to maintain simplicity in the figure.

Although recess 307 in substrate 305 is shown as extending from edge to edge of substrate 305, recess 307 may be formed so that it stops prior to reaching one or both of the respective edges of substrate 305.

Figure 4:
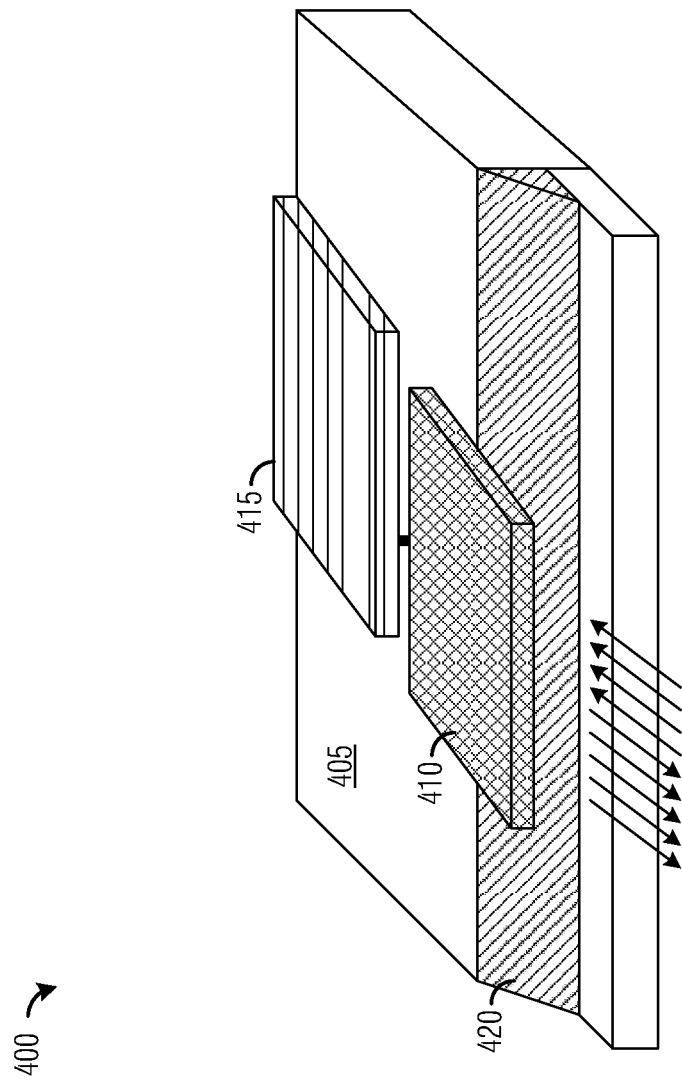
FIG. 4 illustrates an example perspective view of a multi-chip module according to example embodiments described herein.

FIG. 4 illustrates a perspective view of a multi-chip module 400. As shown in FIG. 4, multi-chip module 400 includes a substrate 405 with a recess or step formed along a portion of its perimeter. A first die 410 having opto-electric circuitry and a second die 415 having electric circuitry may be mounted on a surface of substrate 405. A portion of first die 410 overhangs the recess with the portion of first die 410 that overhangs the recess including optical detectors and/or optical emitters. First die 410 may be electrically coupled to second die 415.

A mirror 420 may be disposed in the recess of substrate 405. As shown in FIG. 4, minor 420 may be formed from edge to edge of a side of substrate 405. Also shown in FIG. 4 are example light beams emitted by first die 410 that may be reflected away from substrate 405 by minor 420 and example light beams that may be reflected onto the opto-electric circuitry of first die 410 by mirror 420. Once again, optional paste or glue is not shown in FIG. 4 to maintain simplicity of the figure.

Figure 5:
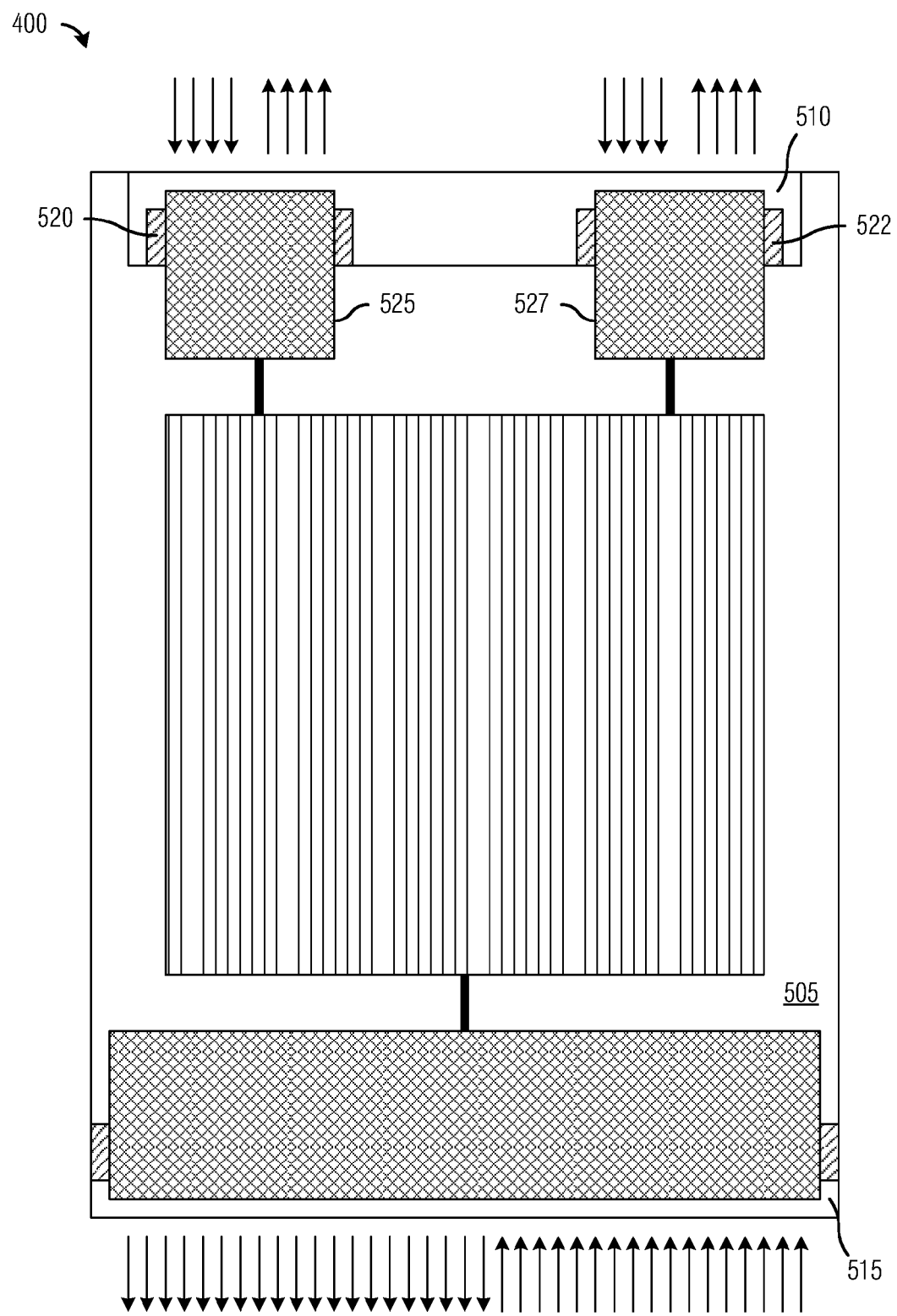
FIG. 5 illustrates an example top view of a multi-chip module with multiple recesses according to example embodiments described herein.

FIG. 5 illustrates a top view of a multi-chip module 500 with multiple recesses. As shown in FIG. 5, multi-chip module 500 includes a substrate 505 with a first recess 510 on a first side of substrate 505 and a second recess 515 on a second side of substrate 505. It is noted that as shown in FIG. 5, first recess 510 does not extend to the edges of the first side, while second recess 515 does extend to the edges of the second side. Furthermore, first recess 510 includes separate minors (e.g., mirror 520 and mirror 522) for separate die (e.g., die 525 and die 527, respectively).

Figure 6A:
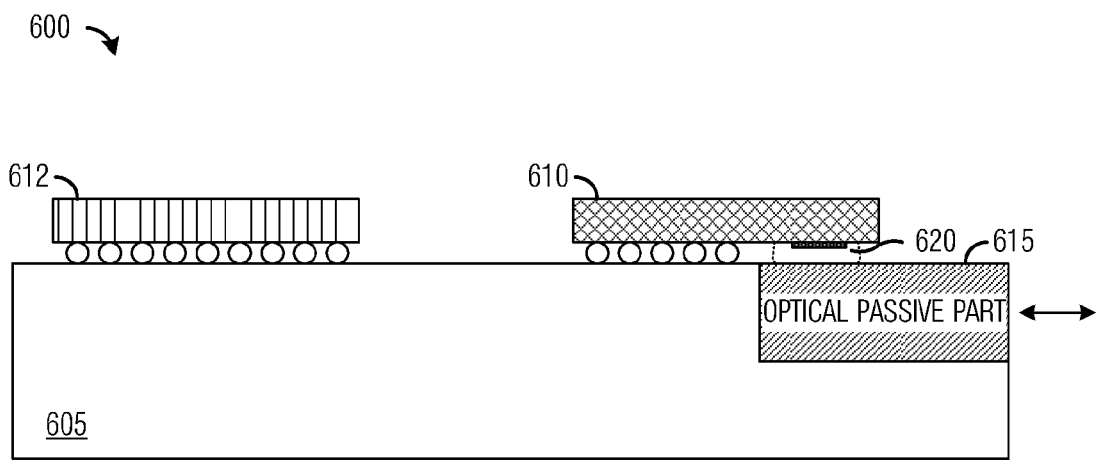
FIGS. 6a and 6b illustrate example side views of multi-chip modules with optical passive parts attached to a side of multi-chip modules according to example embodiments described herein.

FIG. 6a illustrates a side view of a first multi-chip module 600 with an optical passive part disposed in a recess. First multi-chip module 600 includes a substrate 605, as well as a die 610 having opto-electric circuitry and a die 612 having electric circuitry may be mounted on a surface of substrate 605. A portion of die 610 overhangs the recess in substrate 605. An optical passive part 615 is disposed in the recess. As discussed previously, optical passive part 615 may be a fabricated part, such as a molded part, that includes an integrated mirror, lens, mechanical transfer ferrule, and the like, attached to the recess of substrate 605 with a glue and/or paste.

Optical passive part 615 may optionally have lenses to may help process light, as well as guide pins and/or holes that may help to position (as well as potentially secure) optical passive part 615. Optical passive part 615 reflects light emitted by the opto-electric circuitry of die 610 away from substrate 605, while reflecting light incident to substrate 605 onto the opto-electric circuitry. A paste 620, which may be optically transparent to the wavelength of light being used by the optical detectors and/or optical emitters, may be applied to provide mechanical support and/or physical protection for die 610, as well as optical passive part 615.

Figure 6B:
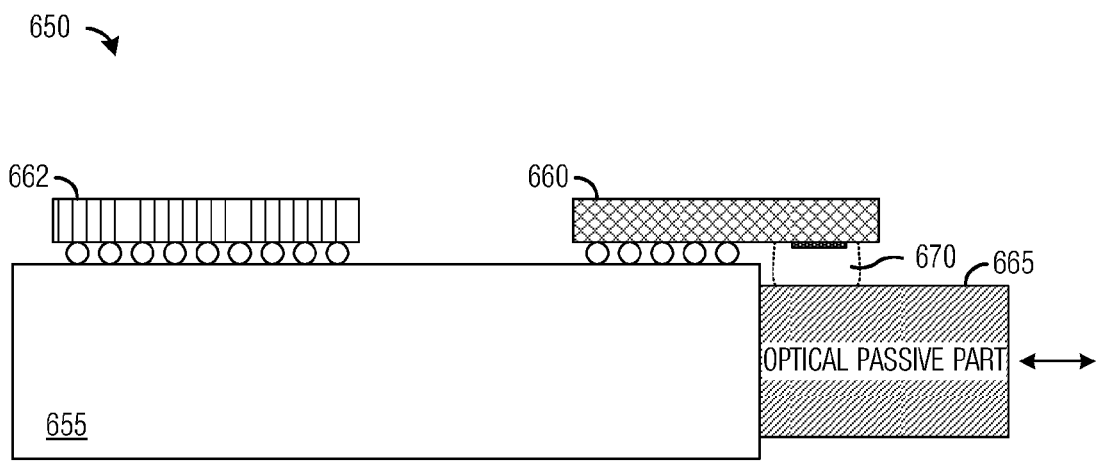

FIG. 6b illustrates a side view of a second multi-chip module 650 with an optical passive part attached to an end of second multi-chip module 650. Second multi-chip module 650 includes a substrate 655, as well as a die 660 having opto-electric circuitry and a die 662 having electric circuitry may be mounted on a surface of substrate 655. A portion of die 660 overhangs the end of substrate 655. An optical passive part 665 is attached to the end of substrate 655. Optical passive part 665 may be attached to the end of substrate 655 with a glue, adhesive, and/or paste.

Optical passive part 665 reflects light emitted by the opto-electric circuitry of die 660 away from substrate 655, while reflecting light incident to substrate 655 onto the opto-electric circuitry. A paste 670, which may be optically transparent to the wavelength of light being used by the optical detectors and/or optical emitters, may be applied to provide mechanical support and/or physical protection for die 660, as well as optical passive part 665.

Figure 7A:
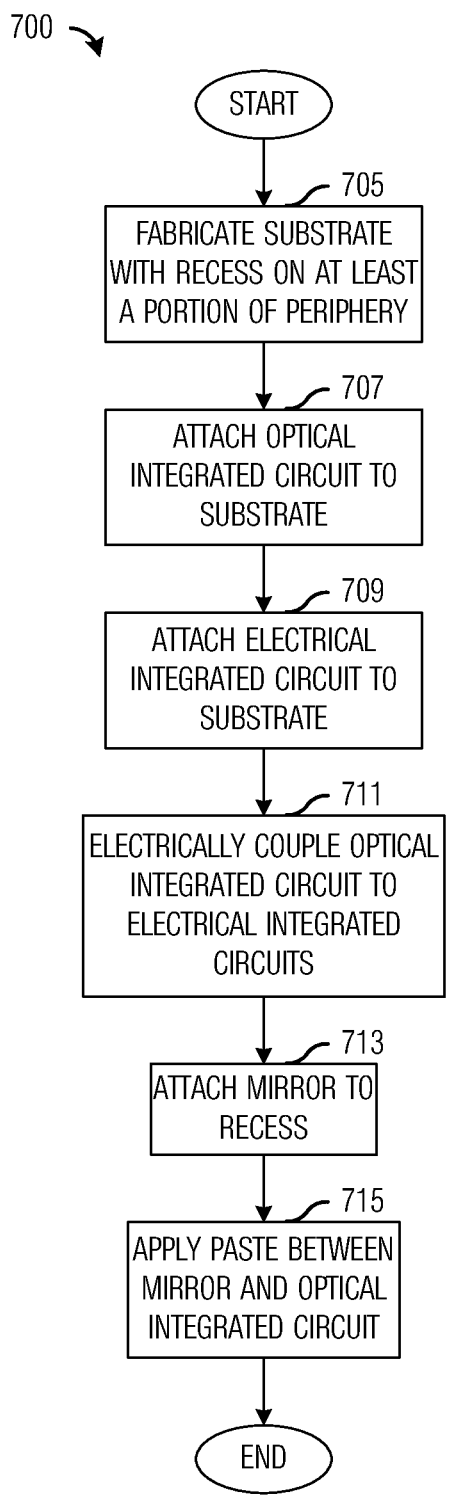
FIG. 7a illustrates an example flow diagram of operations in manufacturing a first multi-chip module according to example embodiments described herein.

FIG. 7a illustrates a flow diagram of operations 700 in manufacturing a first multi-chip module. Operations 700 may be indicative of operations occurring in the manufacturing of a multi-chip module with a mirror disposed in a recess formed in a substrate of the multi-chip module.

Figure 7B:
FIGS. 7b through 7f illustrate example side views of multi-chip modules in differing stages of manufacture according to example embodiments described herein.

Operations 700 may begin with the fabrication of a substrate with a recess on at least a portion of a periphery of the substrate (block 705). As discussed previously, the recess may be as large as needed to permit an integration of a sufficient number of optical detectors and/or optical emitters to meet communications requirements of the multi-chip module. FIG. 7b illustrates a side view of a multi-chip module 730. Multi-chip module 730 is in an early stage of manufacture and comprises a substrate 735 with a recess formed along a portion of its periphery.

Figure 7C:
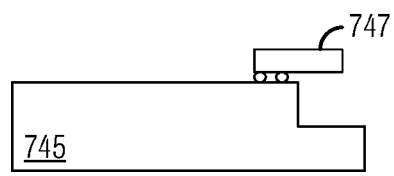

Referring back to FIG. 7a, with the substrate having the recess fabricated, an optical integrated circuit may be attached to the substrate (block 707). The optical integrated circuit may be attached to a side of the substrate so that a portion of the optical integrated circuit overhangs the recess. FIG. 7c illustrates a side view of a multi-chip module 740. Multi-chip module 740 is in an early stage of manufacture and comprises a substrate 745 with a recess formed along a portion of its periphery, and an optical integrate circuit 747 overhanging the recess.

Figure 7D:
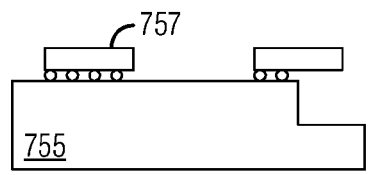

Referring back to FIG. 7a, with the optical integrated circuit attached to the substrate, an electrical integrated circuit may be attached to the substrate (block 709) and electrically coupled to the optical integrated circuit (block 711). The electrical integrated circuit may be attached to the same side of the substrate as the optical integrated circuit or to a different side of the substrate. FIG. 7d illustrates a side view of a multi-chip module 750. Multi-chip module 750 is in a stage of manufacture wherein an electrical integrated circuit 757 has been attached to a substrate 755 and electrical integrated circuit 757 has been electrically coupled to an optical integrated circuit.

Figure 7E:
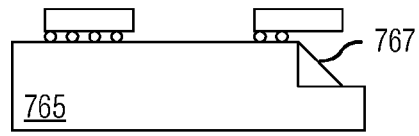

Referring back to FIG. 7a, with the electrical integrated circuit attached to the substrate and electrically coupled to the optical integrated circuit, a minor may be positioned and attached in the recess of the substrate (block 713). The minor may be attached to the recess with an orientation that will allow light emitted by the optical integrated circuit to be reflected out of the substrate and light incident to the substrate to be reflected onto the optical integrated circuit. FIG. 7e illustrates a side view of a multi-chip module 760. Multi-chip module 760 is in a stage of manufacture wherein minor 767 has been attached to substrate 765. Mirror 767 may be attached to substrate 765 using a glue or a paste. It is noted that optical properties of the glue or paste used may not be important since the glue or the paste is likely to not interact with optical signals involved in communications in multi-chip module 760.

Figure 7F:
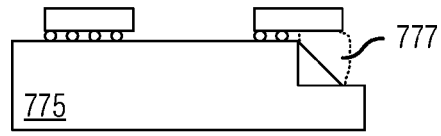

Referring back to FIG. 7a, with the mirror attached to the substrate, a paste or glue that is optically transparent to the wavelength of light being used by the optical detectors and/or optical emitters, may be applied to provide mechanical support and/or physical protection for the minor as well as the optical integrated circuit (block 715). An amount of paste or glue applied may be dependent on a degree of mechanical support and/or physical protection desired. A small amount may be applied to provide a small degree of mechanical support and/or physical protection, while a large amount may be applied to provide a large degree of mechanical support and/or physical protection. FIG. 7f illustrates a side view of a multi-chip module 770. Multi-chip module 770 is in a stage of manufacture wherein a paste or glue 777 has been applied between the optical integrated circuit and the mirror to provide mechanical support and/or physical protection.

Figure 8A:
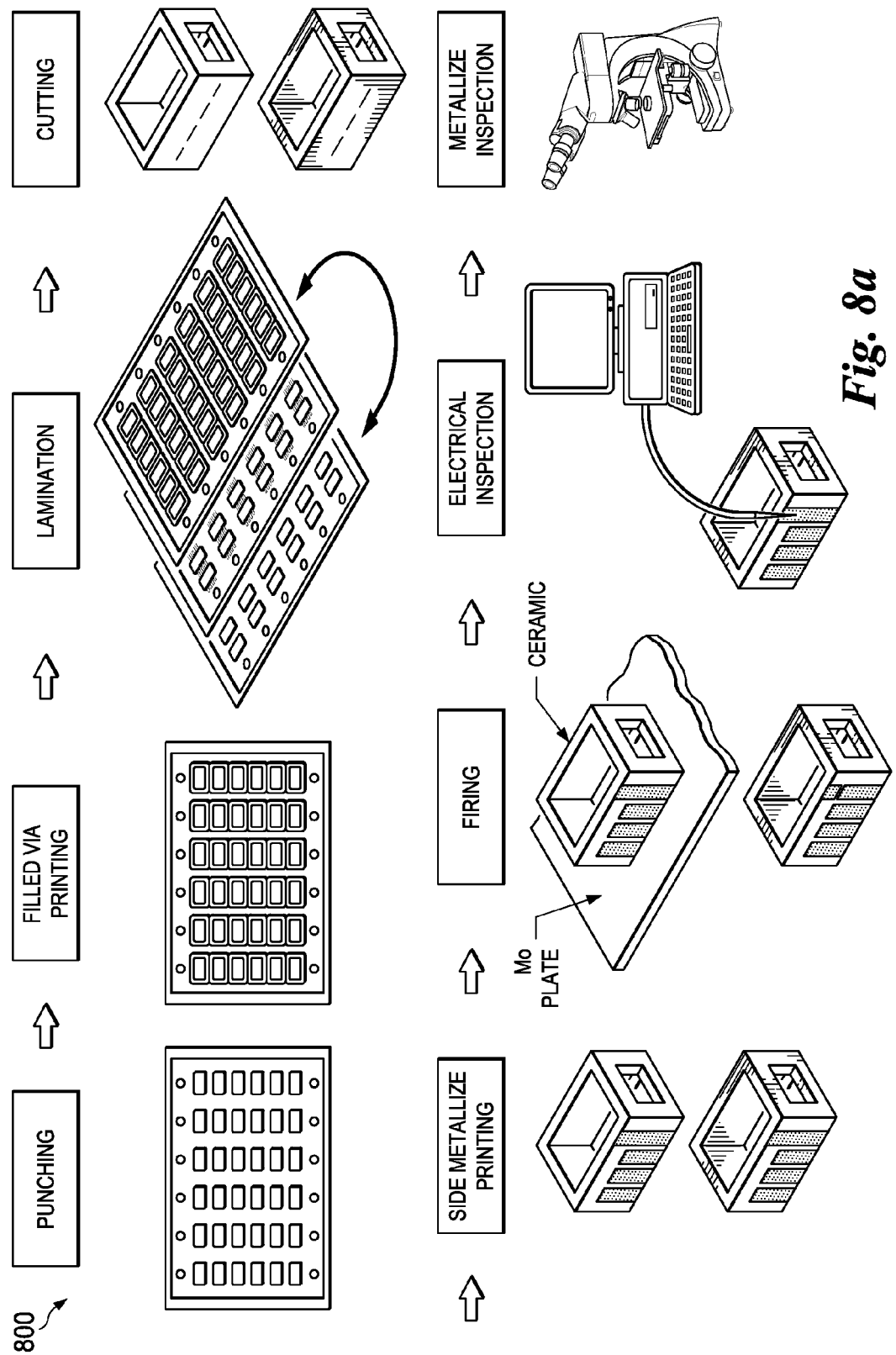
FIG. 8a illustrates an example sequence of operations in manufacturing a multi-layer substrate according to example embodiments described herein.

FIG. 8a illustrates a sequence of operations 800 in manufacturing a multi-layer substrate. Sequence of operations 800 may be indicative of operations in a manufacture of a multi-layer ceramic substrate. The manufacture of the multi-layer ceramic substrate may include laminating and cutting multiple layers of material that will subsequently form the multi-layer substrate. Firing the multiple layers joins the multiple layers into the multi-layer substrate.

Figure 8B:
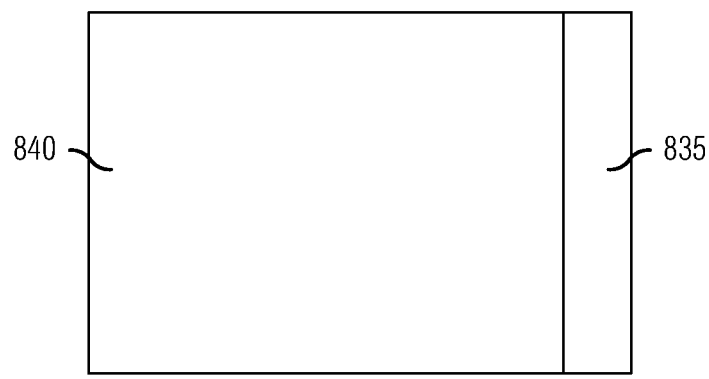
FIGS. 8b and 8c illustrate example top and side views of a multi-layer substrate according to example embodiments described herein.

FIG. 8b illustrates a top view of a multi-layer substrate 830 formed from multiple layers of material. Multi-layer substrate 830 includes a recess formed on an edge. It is noted that a portion of multi-layer substrate 830 without the recess may be formed from a longer piece of material 835, while a portion of multi-layer substrate 830 with the recess may be formed from a shorter piece of material 840.

Figure 8C:
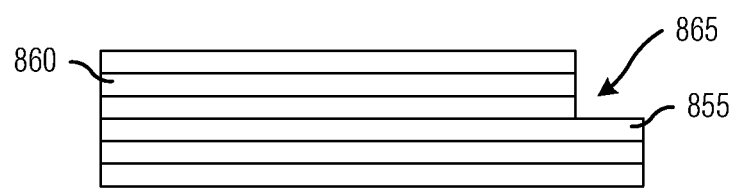

FIG. 8c illustrates a side view of multi-layer substrate 850 formed from multiple layers of material. Multi-layer substrate 830 may be formed from layers of material of differing length. As shown in FIG. 8c, a longer layer of material (such as layer 855) may be used to form a portion of multi-layer substrate 830 without a recess, while a shorter layer of material (such as layer 860) may be used to form a portion of multi-layer substrate 830 with a recess 865.

According to an example embodiment, a substrate with a recess may also be formed through an etching process (or milling process), wherein an etch (or milling) may be used to remove material from the substrate, leaving the recess on the substrate. According to an example embodiment, a substrate with a recess may also be formed through a physical substrate cutting process, wherein a mechanical cutter, such as a saw, may be used to remove material to form the recess.

Figure 9A:
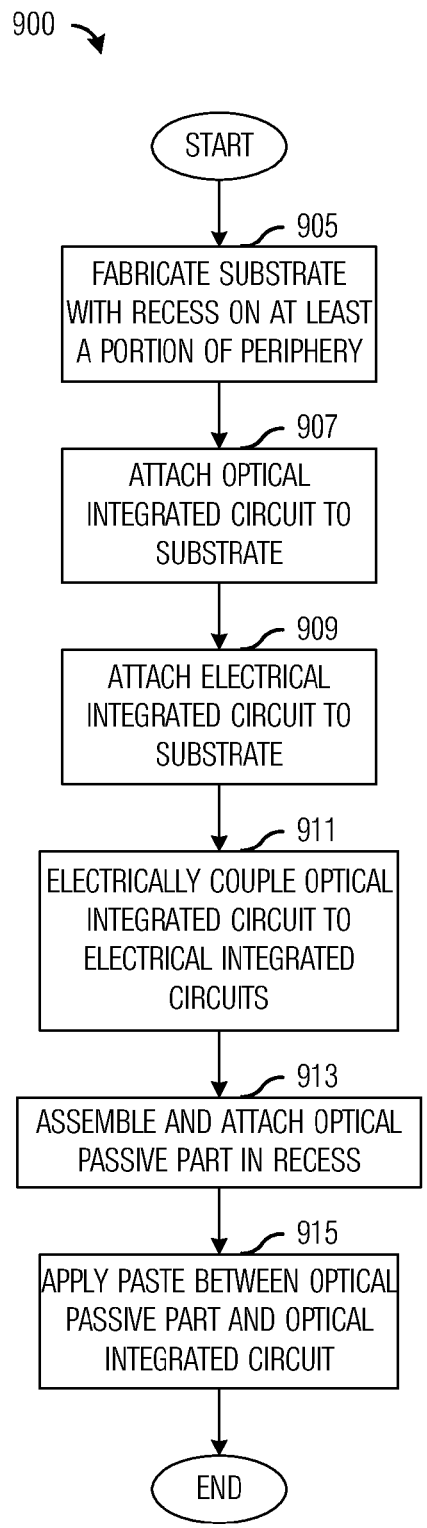
FIG. 9a illustrates an example flow diagram of operations in manufacturing a second multi-chip module according to example embodiments described herein.

FIG. 9a illustrates a flow diagram of operations 900 in manufacturing a second multi-chip module. Operations 900 may be indicative of operations occurring in the manufacturing of a second multi-chip module with an optical passive part disposed in a recess formed in a substrate of the second multi-chip module.

Figure 9B:
FIGS. 9b through 9f illustrate example side views of second multi-chip modules in differing stages of manufacture according to example embodiments described herein.

Operations 900 may begin with the fabrication of a substrate with a recess on at least a portion of a periphery of the substrate (block 905). As discussed previously, the recess may be as large as needed to permit an integration of a sufficient number of optical detectors and/or optical emitters to meet communications requirements of the multi-chip module. FIG. 9b illustrates a side view of a multi-chip module 930. Multi-chip module 930 is in an early stage of manufacture and comprises a substrate 935 with a recess formed along a portion of its periphery.

Figure 9C:
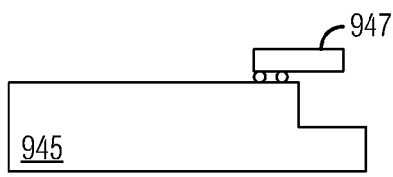

Referring back to FIG. 9a, with the substrate having the recess fabricated, an optical integrated circuit may be attached to the substrate (block 907). The optical integrated circuit may be attached to a side of the substrate so that a portion of the optical integrated circuit overhangs the recess. FIG. 9c illustrates a side view of a multi-chip module 940. Multi-chip module 940 is in an early stage of manufacture and comprises a substrate 945 with a recess formed along a portion of its periphery, and an optical integrated circuit 947 overhanging the recess.

Figure 9D:
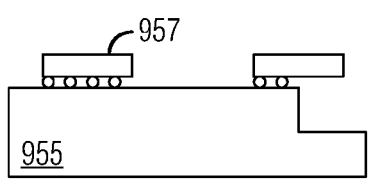

Referring back to FIG. 9a, with the optical integrated circuit attached to the substrate, an electrical integrated circuit may be attached to the substrate (block 909) and electrically coupled to the optical integrated circuit (block 911). The electrical integrated circuit may be attached to the same side of the substrate as the optical integrated circuit or to a different side of the substrate. FIG. 9d illustrates a side view of a multi-chip module 950. Multi-chip module 950 is in a stage of manufacture wherein an electrical integrated circuit 957 has been attached to a substrate 955 and electrical integrated circuit 957 has been electrically coupled to an optical integrated circuit.

Figure 9E:
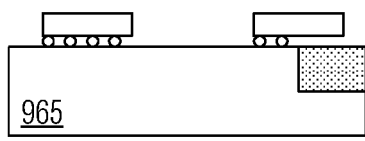

Referring back to FIG. 9a, with the electrical integrated circuit attached to the substrate and electrically coupled to the optical integrated circuit, an optical passive part may be positioned and attached in the recess of the substrate (block 913). The optical passive part may be attached to the recess with an orientation that will allow light emitted by the optical integrated circuit to be reflected out of the substrate and light incident to the substrate to be reflected onto the optical integrated circuit. FIG. 9e illustrates a side view of a multi-chip module 960. Multi-chip module 960 is in a stage of manufacture wherein an optical passive part 967 has been attached to substrate 965. Optical passive part 967 may be attached to substrate 965 using a glue or a paste. Top and side views of an example optical passive part are also shown. It is noted that optical properties of the glue or paste used may not be important since the glue or the paste is likely to not interact with optical signals involved in communications in multi-chip module 960.

Figure 9F:
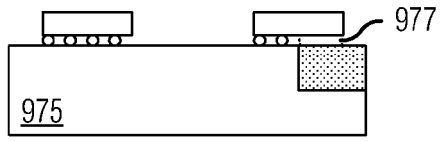

Referring back to FIG. 9a, with the optical passive part attached to the substrate, a paste or glue that is optically transparent to the wavelength of light being used by the optical detectors and/or optical emitters, may be applied to provide mechanical support and/or physical protection for the minor as well as the optical integrated circuit (block 915). An amount of paste or glue applied may be dependent on a degree of mechanical support and/or physical protection desired. A small amount may be applied to provide a small degree of mechanical support and/or physical protection, while a large amount may be applied to provide a large degree of mechanical support and/or physical protection. FIG. 9f illustrates a side view of a multi-chip module 970. Multi-chip module 970 is in a stage of manufacture wherein a paste or glue 977 has been applied between the optical integrated circuit and the optical passive part to provide mechanical support and/or physical protection.

Figure 10A:
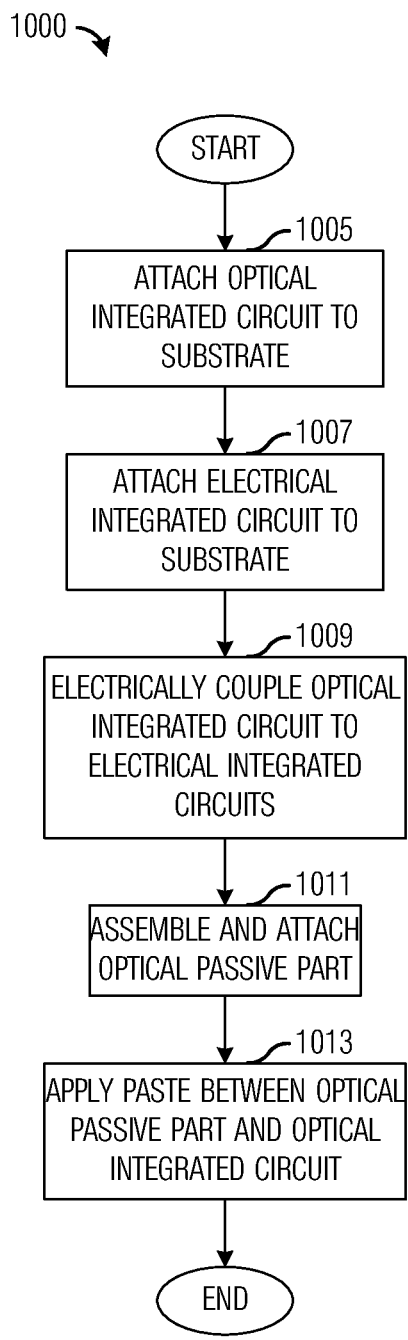
FIG. 10a illustrates an example flow diagram of operations in manufacturing a third multi-chip module according to example embodiments described herein.

FIG. 10a illustrates a flow diagram of operations 1000 in manufacturing a third multi-chip module. Operations 1000 may be indicative of operations occurring in the manufacturing of a third multi-chip module with an optical passive part attached to a side of a substrate of the third multi-chip module. The third multi-chip module may be formed from substrates such as printed circuit boards, organic package substrates, ceramic high temperature cofired ceramic substrates, ceramic low temperature cofired ceramic substrates, and the like. It is noted that although an optical passive part is discussed as being attached to the side of the substrate, it is also possible to have a minor attached to the side of the substrate.

Figure 10B:
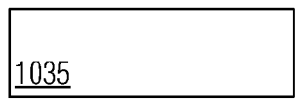
FIGS. 10b through 10f illustrate example side views of third multi-chip modules in differing stages of manufacture according to example embodiments described herein.
Figure 10C:
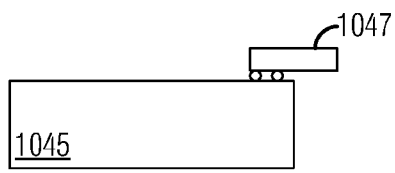

Operations 1000 may begin with the fabrication of a substrate and then attaching an optical integrated circuit to the substrate (block 1005). As discussed previously, the optical integrated circuit may be attached to the substrate in such a way that a portion of the optical integrated circuit overhangs the substrate. FIG. 10b illustrates a side view of a multi-chip module 1030. Multi-chip module 1030 is in an early stage of manufacture and comprises a substrate 1035. FIG. 10c illustrates a side view of a multi-chip module 1040. Multi-chip module 1040 is in an early stage of manufacture and comprises a substrate 1045 and an optical integrated circuit 1047 overhanging a side of substrate 1045.

Figure 10D:
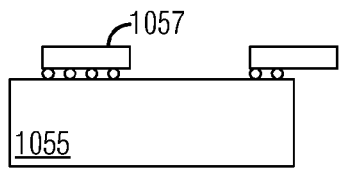

Referring back to FIG. 10a, with the optical integrated circuit attached to the substrate, an electrical integrated circuit may be attached to the substrate (block 1007) and electrically coupled to the optical integrated circuit (block 1009). The electrical integrated circuit may be attached to the same side of the substrate as the optical integrated circuit or to a different side of the substrate. FIG. 10d illustrates a side view of a multi-chip module 1050. Multi-chip module 1050 is in a stage of manufacture wherein an electrical integrated circuit 1057 has been attached to a substrate 1055 and electrical integrated circuit 1057 has been electrically coupled to an optical integrated circuit.

Figure 10E:
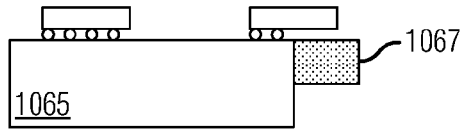

Referring back to FIG. 10a, with the electrical integrated circuit attached to the substrate and electrically coupled to the optical integrated circuit, an optical passive part may be positioned and attached to a side of the substrate (block 1011). The optical passive part may be attached to the side of the substrate with an orientation that will allow light emitted by the optical integrated circuit to be reflected out of the substrate and light incident to the substrate to be reflected onto the optical integrated circuit. FIG. 10e illustrates a side view of a multi-chip module 1060. Multi-chip module 1060 is in a stage of manufacture wherein an optical passive part 1067 has been attached to the side of substrate 1065. Optical passive part 1067 may be attached to substrate 1065 using a glue or a paste. It is noted that optical properties of the glue or paste used may not be important since the glue or the paste is likely to not interact with optical signals involved in communications in multi-chip module 1060.

Figure 10F:
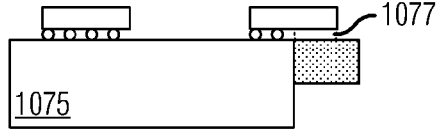

Referring back to FIG. 10a, with the optical passive part attached to the substrate, a paste or glue that is optically transparent to the wavelength of light being used by the optical detectors and/or optical emitters, may be applied to provide mechanical support and/or physical protection for the minor as well as the optical integrated circuit (block 1013). An amount of paste or glue applied may be dependent on a degree of mechanical support and/or physical protection desired. A small amount may be applied to provide a small degree of mechanical support and/or physical protection, while a large amount may be applied to provide a large degree of mechanical support and/or physical protection. FIG. 10f illustrates a side view of a multi-chip module 1070. Multi-chip module 1070 is in a stage of manufacture wherein a paste or glue 1077 has been applied between the optical integrated circuit and the optical passive part to provide mechanical support and/or physical protection.

Although the present invention and its advantages have been described in detail, it should be understood that various changes, substitutions and alterations can be made herein without departing from the spirit and scope of the invention as defined by the appended claims.

What is claimed is:

1. An integrated circuit package comprising:
   a substrate having a recess disposed along at least a portion of a perimeter of the substrate;
   an optical die having opto-electric circuitry, the optical die coupled face down to a top surface of the substrate such that a portion of the optical die with the opto-electric circuitry overhangs the recess; and
   an optical unit disposed in the recess and configured such that optical signals emitted by the opto-electric circuitry are reflected away from the substrate and incident optical signals are reflected onto the opto-electric circuitry, wherein an entire reflective surface of the optical unit is optically unobstructed laterally out from the perimeter of the substrate.

2. The integrated circuit package of claim 1, wherein the optical unit comprises a mirror.

3. The integrated circuit package of claim 2, wherein the mirror is oriented at about 45 degrees.

4. The integrated circuit package of claim 1, wherein the optical unit comprises an optical passive package.

5. The integrated circuit package of claim 4, wherein the optical passive package comprises an integrated mirror, a mechanical transfer ferrule, a lens, or a combination thereof.

6. The integrated circuit package of claim 1, further comprising an optically transparent paste disposed in a gap between the optical die and the optical unit.

7. The integrated circuit package of claim 1, wherein the opto-electric circuitry comprises an optical detector, an optical emitter, or a combination thereof.

8. The integrated circuit package of claim 1, further comprising an electrical die having electric circuitry, the electrical die coupled to the substrate and operatively coupled to the optical die.

9. The integrated circuit package of claim 1, wherein the substrate comprises:
   a first substrate layer with a first length; and
   a second substrate layer with a second length shorter than the first length, and stacked above the first substrate layer, wherein the recess is above a section of the first substrate that does not overlap the second substrate.

10. The integrated circuit package of claim 1, wherein the recess is an etched section of the substrate.

11. The integrated circuit package of claim 1, wherein the recess is a milled section of the substrate.

12. An integrated circuit package comprising:
    a substrate;
    an optical unit coupled to an end of the substrate; and
    an opto-electric die having opto-electric circuitry, the opto-electric die coupled face down to a top surface of the substrate such that a portion of the opto-electric die with the opto-electric circuitry overhangs the end of the substrate over the optical unit,
    wherein the optical unit is configured such that optical signals emitted by the opto-electric circuitry are reflected away from the substrate and incident optical signals are reflected onto the opto-electric circuitry, wherein an entire reflective surface of the optical unit is optically unobstructed laterally out from the end of the substrate.

13. The integrated circuit package of claim 12, wherein the optical unit comprises a mirror, or an optical passive package.

14. The integrated circuit package of claim 12, wherein the substrate comprises a printed circuit board, an organic package substrate, a ceramic high temperature cofired ceramic substrate, or a ceramic low temperature cofired ceramic substrate.

15. The integrated circuit package of claim 12, further comprising an optically transparent paste disposed in a gap between the opto-electric die and the optical unit.

16. The integrated circuit package of claim 12, further comprising an electrical die having electric circuitry, the electrical die coupled to the substrate and operatively coupled to the opto-electric die.

17. The integrated circuit package of claim 12, wherein the opto-electric die is coupled to the circuit with a ball grid array, a land grid array, a bonding wire, or a combination thereof.

18. A method of manufacturing a multi-chip module, the method comprising:
    forming a recess in a substrate along at least a portion of a perimeter of the substrate;
    attaching an optical die with opto-electric circuitry face down to a top surface of the substrate so that at least a portion of the optical die with the opto-electric circuitry overhangs the recess; and
    placing an optical unit in the recess so that an entire reflective surface of the optical unit is optically unobstructed laterally out from the perimeter of the substrate, and oriented so that optical signals emitted by the opto-electric circuitry are reflected away from the substrate and incident optical signals are reflected onto the opto-electric circuitry.

19. The method of claim 18, further comprising applying an optically transparent paste between the optical unit and the optical die.

20. The method of claim 18, further comprising:
    attaching an electrical die with electric circuitry to the substrate; and
    electrically coupling the electrical die to the optical die.

21. The method of claim 18, wherein the optical unit comprises a mirror or an optical passive package.

22. The method of claim 18, wherein forming the recess in the substrate comprises stacking a first substrate layer with a first length onto a second substrate layer with a second length different from the first length.

23. The method of claim 18, wherein forming the recess in the substrate comprises milling the recess from the substrate.

24. The method of claim 18, wherein forming the recess in the substrate comprises etching the recess into the substrate.

\* \* \* \* \*